(12) United States Patent
Qu et al.

(10) Patent No.: US 8,183,164 B2
(45) Date of Patent: May 22, 2012

(54) METHOD FOR PREFERENTIAL GROWTH OF SEMICONDUCTING VERTICALLY ALIGNED SINGLE WALLED CARBON NANOTUBES

(75) Inventors: Liangti Qu, Dayton, OH (US); Liming Dai, Beavercreek, OH (US)

(73) Assignee: University of Dayton, Dayton, OH (US)

( * ) Notice: Subject to any disclaimer, the term of this patent is extended or adjusted under 35 U.S.C. 154(b) by 286 days.

(21) Appl. No.: 12/511,517

(22) Filed: Jul. 29, 2009

(65) Prior Publication Data
US 2011/0024717 A1    Feb. 3, 2011

Related U.S. Application Data

(60) Provisional application No. 61/084,292, filed on Jul. 29, 2008.

(51) Int. Cl.
*H01L 21/00*      (2006.01)

(52) U.S. Cl. ............... 438/775; 257/9; 257/E21.051

(58) Field of Classification Search .......... 438/775–777, 438/478; 257/9, E21.051, E29.082
See application file for complete search history.

(56) References Cited

U.S. PATENT DOCUMENTS

| | | | |
|---|---|---|---|
| 7,288,490 B1 * | 10/2007 | Delzeit | 438/758 |
| 2008/0296537 A1 * | 12/2008 | Gordon et al. | 252/506 |
| 2008/0318049 A1 | 12/2008 | Hata et al. | |
| 2009/0108251 A1 | 4/2009 | Kabir | |
| 2009/0121343 A1 | 5/2009 | Basker et al. | |
| 2010/0098904 A1 * | 4/2010 | Dai et al. | 428/119 |

* cited by examiner

*Primary Examiner* — Tony Tran
(74) *Attorney, Agent, or Firm* — Dinsmore & Shohl LLP

(57) ABSTRACT

A method and system for the preferential growth of semiconducting vertically-aligned single-walled carbon nanotubes (VA-SWNTs) is provided. The method combines the use of plasma-enhanced chemical vapor deposition at low pressure with rapid heating. The method provides a high yield of up to approximately 96% semiconducting SWNTs in the VA-SWNT array. The as-synthesized semiconducting SWNTs can be used directly for fabricating field effect transistor (FET) devices without the need for any post-synthesis purification or separation.

8 Claims, 9 Drawing Sheets

METHOD FOR PREFERENTIAL GROWTH OF SEMICONDUCTING VERTICALLY ALIGNED SINGLE WALLED CARBON NANOTUBES

CROSS-REFERENCE TO RELATED APPLICATIONS

This application claims the benefit of U.S. Provisional Application No. 61/084,292, filed Jul. 29, 2008, entitled SYNTHESES OF SEMICONDUCTING VERTICALLY ALIGNED SINGLE WALLED CARBON NANOTUBES FOR DIRECT USE IN FIELD EFFECT TRANSISTOR. The entire contents of said application is hereby incorporated by reference.

GOVERNMENT RIGHTS

The government has rights in the invention pursuant to Contract No. FA9550-06-1-0384 awarded by Air Force Office of Scientific Research and Contract No. NIRT 0609077 awarded by the National Science Foundation.

BACKGROUND OF THE INVENTION

The present invention generally relates to single-walled carbon nanotubes (SWNTs) and, in particular, relates to a method for preferential growth of semiconducting vertically-aligned single-walled carbon nanotubes (VA-SWNTs) for use in field effect transistor devices.

Carbon nanotubes can be conceptually viewed as a graphene sheet rolled up into a nanoscale tube form to produce single-walled carbon nanotubes (SWNTs). There may be additional graphene tubes around the core of a SWNT to form multiwalled carbon nanotubes (MWNTs). Depending on their diameter and helicity of the arrangement of carbon atoms in the nanotube walls, SWNTs can exhibit semiconducting or metallic behavior. Semiconducting SWNTs have been demonstrated to be promising building blocks for constructing various electronic devices for a large variety of applications, ranging from chemical/bio-sensors to molecular electronics. For many of these applications, field effect transistors (FETs) made from SWNTs often play an important role.

One of the setbacks which has prevented widespread application of SWNTs in semiconductor electronics is the coexistence of both metallic and semiconducting carbon nanotubes in the as-synthesized samples. Due to the presence of metallic tubes, FET characteristics (e.g. the on/off ratio and integration uniformity) can become poor and uncontrollable. For example, the on/off ratio is typically less than 10 for FETs based on nonseparated carbon nanotube network films. This ratio is generally too small for any practical application. Therefore, it is important to separate metallic nanotubes from semiconducting SWNTs for constructing nanotube-based semiconductor devices having high performance.

A few separation approaches have been employed, including electrophoresis, tube-type-specific physicochemical modification, and selective elimination of metallic SWNTs by electrical breakdown, laser irradiation or gas-phase plasma etching. However, the problem associated with the coexisting metallic nanotubes has not yet been completely solved as the post-synthesis separation processes can often be tedious and may cause possible contamination or degradation of nanotubes. Therefore, it would be desirable to provide preferential synthesis of semiconducting SWNTs directly on a suitable substrate for direct use in FETs.

It would also be preferable to grow aligned/micropatterned SWNTs for electronic applications as their structure-property can be readily assessed, and they can be effectively incorporated into devices. The vertically-aligned structure can not only provide a well-defined large surface area for the device performance enhancement but can also allow controlled functionalization of nanotubes along the tube length for incorporating multifunctionalities. Although the growth of aligned/micropatterned MWNTs is known, the synthesis of aligned SWNT arrays has not been successful.

Accordingly, there is still a need in the art for a method of providing selective growth of semiconducting VA-SWNTs, and to semiconducting VA-SWNTs which can be directly used as the electronically active materials in FET devices without requiring any purification or separation processes.

SUMMARY OF THE INVENTION

Embodiments of the invention provide a method for the preferential growth of semiconducting vertically-aligned single-walled carbon nanotubes (VA-SWNTs) utilizing a plasma enhanced chemical vapor deposition (PECVD) method utilizing controlled gas flow pressure, temperature, and time. The method provides a high yield of up to approximately 96% semiconducting SWNTs in the VA-SWNT array. The as-synthesized semiconducting SWNTs can be used directly for fabricating field effect transistor (FET) devices without the need for any post-synthesis purification or separation.

According to one embodiment of the invention, a method is provided for synthesizing semiconducting vertically-aligned single-walled carbon nanotubes comprising providing a semiconductor wafer containing a catalyst coating on its surface; providing an iron catalyst on the catalyst-coated wafer; placing the wafer in a plasma-enhanced chemical vapor deposition furnace maintained at a pressure between about 25 to 35 mTorr and at a temperature of about between about 745 to 755° C., where the furnace includes a source of carbon gas; and removing the wafer from the chamber after about 2 to 4 minutes.

In one embodiment, the carbon gas comprises $C_2H_2$ and preferably does not include a carrier gas. The gas in the furnace is preferably maintained at a pressure of about 30 mTorr and a temperature of about 750° C.

The semiconductor substrate or wafer preferably comprises $SiO_2/Si$ and the catalyst coating on the wafer surface preferably comprises aluminum.

In one embodiment, the method further includes forming an FET device from the synthesized semiconducting vertically-aligned single-walled carbon nanotubes comprising depositing the nanotubes over preformed source and drain electrodes supported on the wafer.

The vertically-aligned single-walled carbon nanotubes formed by the method of the invention preferably have a diameter of from about 0.8 to about 2 nm.

In one embodiment, the nanotubes synthesized on the wafer comprise at least 80% semiconducting nanotubes. In another embodiment, the nanotubes synthesized on the wafer comprise at least 95% semiconducting nanotubes.

Accordingly, it is a feature of embodiments of the invention to synthesize semiconducting vertically-aligned single-walled carbon nanotubes for direct use in field effect transistors without post-synthesis purification or separation. This, and other features and advantages of the invention will become apparent from the following detailed description, the accompanying drawings, and the appended claims.

BRIEF DESCRIPTION OF THE DRAWINGS

The following detailed description of specific embodiments of the present disclosure can be best understood when read in conjunction with the following drawings, where like structure is indicated with like reference numerals and in which.

DETAILED DESCRIPTION OF THE PREFERRED EMBODIMENTS

Embodiments of the method of the invention provide selective growth of semiconducting VA-SWNTS by using a plasma-enhanced chemical vapor deposition process which combines fast heating (about 3 minutes) in a low pressure environment using $C_2H_2$ as a carbon source without the use of any additional carrier gas.

In a preferred embodiment for synthesizing semiconducting VA-SWNT arrays, a thin film of an iron catalyst is coated on a catalyst-coated $SiO_2$/Si wafer. Preferably, the iron catalyst is sputter-coated on the $SiO_2$ surface of the wafer at a thickness of about 0.5 nm. The catalyst coating on the wafer may comprise aluminum, and preferably has a layer thickness of about 10 nm. The aluminum coating is used to prevent Fe catalyst nanoparticles from aggregation during the growth of VA-SWNTs. To initiate nanotube growth, the iron-coated $SiO_2$/Si wafer with the aluminum coating is quickly moved from a room temperature environment (about 25° C.) into a plasma-enhanced chemical vapor deposition furnace. The furnace is preferably operated at about 80 W. The furnace is preferably maintained at a temperature of about 750° C. under a pure gas flow of $C_2H_2$ at a low pressure of about 30 mTorr. After about 3 minutes, the nanotube deposited wafer is then taken out of the furnace.

The as-synthesized SWNTs have diameters ranging from about 0.8 to 2 nm. The quantity or content of semiconductive nanotubes in the SWNTs is up to 96%. While not wishing to be bound by theory, it is believed that the high percentage content is due to the combined plasma-enhanced CVD and fast heating method using pure $C_2H_2$ under low pressure.

We have found that the high yield of semiconducting SWNTs produced by the preferential synthesis allows the direct use of the as-synthesized SWNTs for constructing nanotube FETs without any post-synthesis purification or separation, which is typically necessary for the use of other nanotube samples in FETs.

Figure 6:
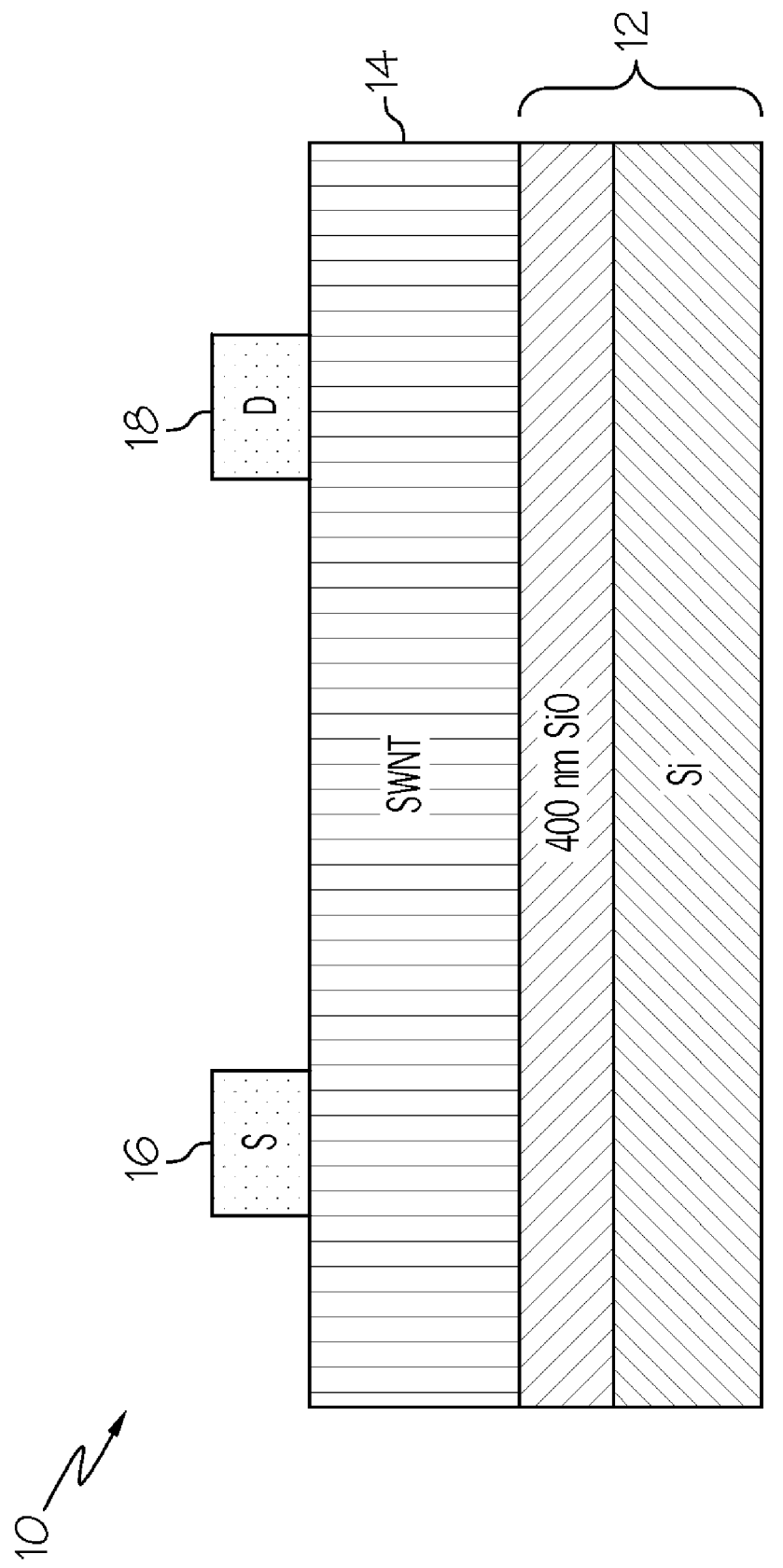
FIG. 6 is a sectional view of a FET device formed in accordance with an embodiment of the invention.

An example of a FET device including the as-synthesized SWNTs is shown in FIG. 6. The FET device 10 includes the $SiO_2$/Si wafer 12 with the SWNTs 14 deposited on its surface and source and drain electrodes 16, 18. Such a device may be formed, for example, by solution casting the as-synthesized VA-SWNTs between drain and source electrodes on a $SiO_2$/Si wafer with the silicon substrate acting as a gate electrode.

In order that the invention may be more readily understood, reference is made to the following examples which are intended to illustrate the invention, but not limit the scope thereof.

Example 1

In a method of synthesizing semiconducting VA-SWNT arrays, a thin film of iron (Fe) having thickness of 0.5 nm was sputter-coated on a 10-nm thick aluminum (Al) layer pre-coated on the silicon dioxide ($SiO_2$) surface of a $SiO_2$/Si wafer. To start the nanotube growth process, the catalyst-coated $SiO_2$/Si wafer was quickly (<5 seconds) moved from a cool zone (approximately 25° C.) into the center of a plasma-enhanced (80 W, 13.56 MHz) tube furnace heated at about 750° C. under a pure gas flow of acetylene ($C_2H_2$) (e.g., atomic absorption grade, 99.8%, Airgas Great Lakes. Inc.) at a low pressure of approximately 30 mTorr. Approximately three minutes later, the nanotube deposited $SiO_2$/Si wafer was taken out from the furnace for subsequent analyses without any purification.

Figure 1:
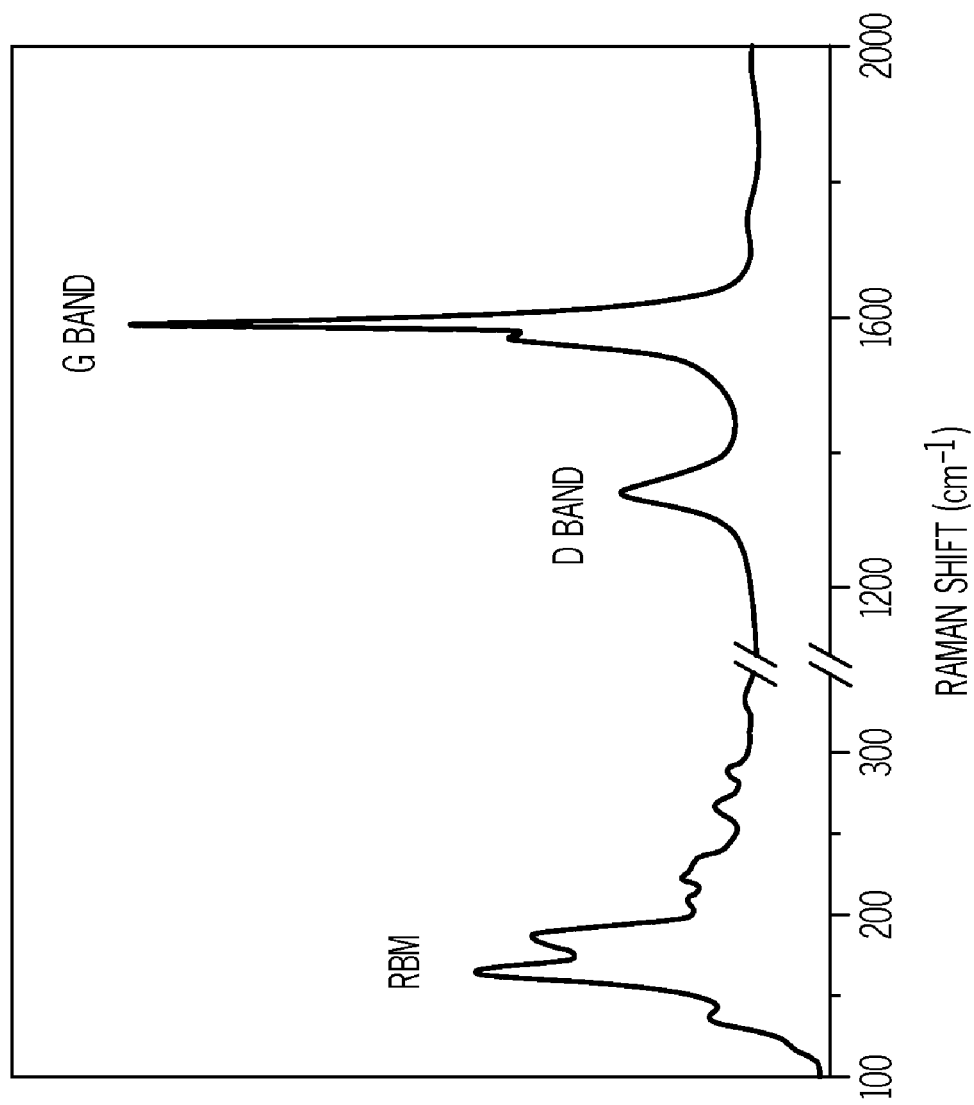
FIG. 1 illustrates Raman spectrum of as-grown SWNTS formed according to an embodiment of the invention.

Scanning electron microscopic (e.g., Hitachi S-4800 high-resolution SEM) images showed a homogenous coverage of about 2-3 µm long well-aligned nanotubes over the whole substrate surface. A transmission electron microscopic (e.g., Hitachi H-7600 TEM unit) image for the constituent nanotubes taken from an ethanol dispersion of the VA-SWNT sample revealed SWNT characteristics for each of the individual nanotubes. Atomic force microscopic (AFM) analyses showed diameters in the range of about 0.8 nm to about 2 nm for the as-synthesized SWNTs. The corresponding Raman spectrum (e.g., in Via micro-Raman spectrometer, Renishaw) recorded with a 514-nm laser for the nanotube sample clearly shows the radial breathing mode (RBM) for SWNTs, as illustrated in FIG. 1.

Figure 2A:
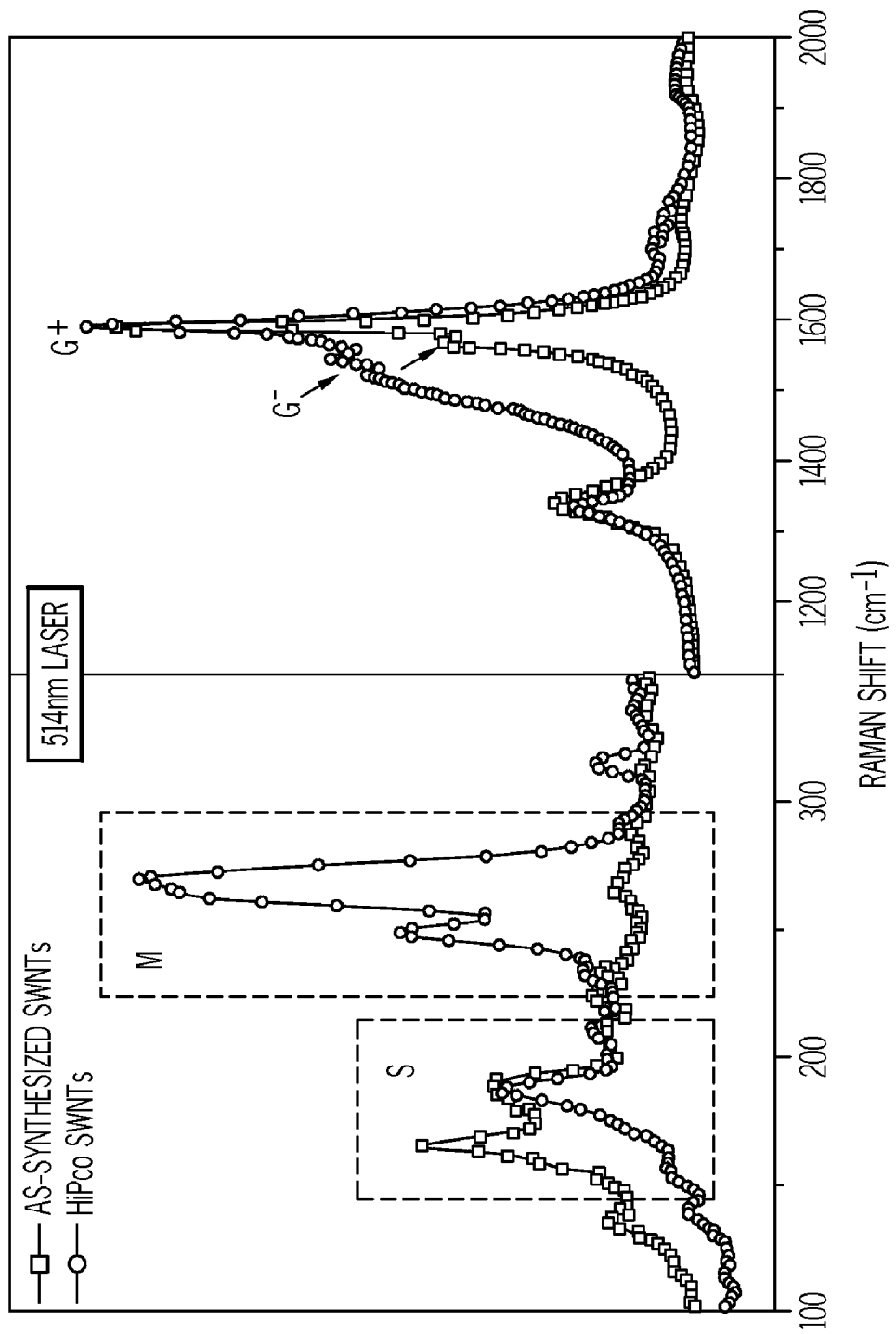
FIGS. 2a and 2b illustrate a Raman spectra comparison of as-synthesized SWNTs and HiPco SWNTs according to an embodiment of the invention.

The RBM of Raman spectra was used to assign and quantitatively evaluate metallic and semiconducting nanotubes. To confirm the semiconducting properties of the as-synthesized VA-SWNTs, Raman spectra were systematically measured with laser beams of different excitation wavelengths. Commercial HiPco SWNTs with a known metallic-to-semiconducting ratio (e.g., about 40%:60%) were used as reference. FIG. 2a shows the spectroscopic details over the RBM and G-band regions recorded with the 514-nm laser (2.41 eV) for the as-synthesized VA-SWNTs and HiPco SWNTs to give a qualitative indication of the relative population of semiconducting to metallic nanotubes in these samples. As expected, the HiPco SWNTs showed typical RBM features for semiconducting nanotubes over about 150-210 $cm^{-1}$ and metallic nanotubes in the region between about 210 and about 280 $cm^{-1}$, along with a strong and broad Breit-Wigner-Fano (BWF) line shape for the $G^-$ band associated with metallic nanotubes, shown as curves with circular dots in FIG. 2a. In contrast, the corresponding Raman spectrum of the as-synthesized VA-SWNTs (shown as curves with square dots in FIG. 2a was dominated by spectroscopic features characteristic of semiconducting SWNTs in both the RBM and G band regions, indicating the presence of a high percentage of semiconducting nanotubes.

Figure 2B:
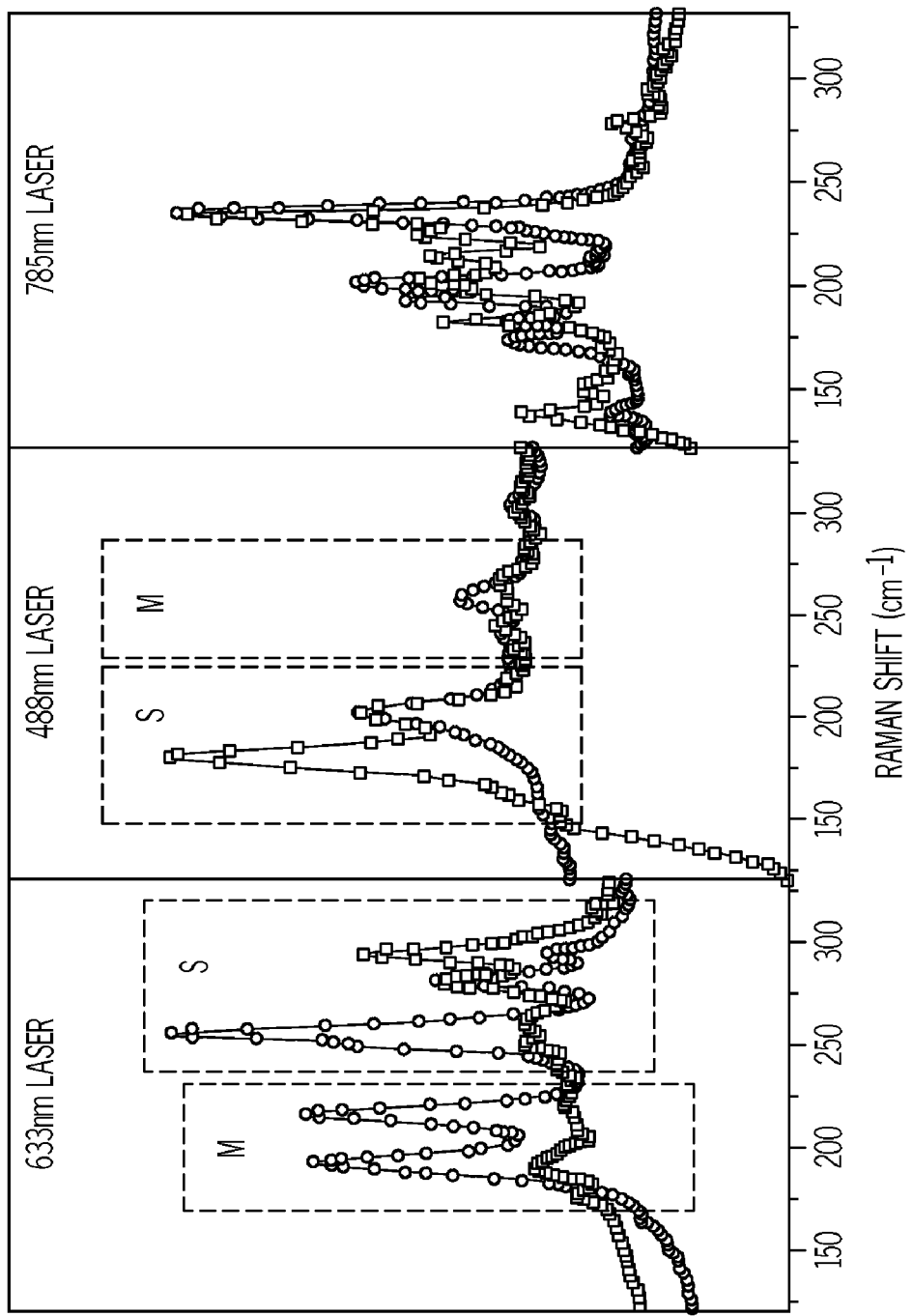

Further evidence for the high percentage of semiconducting nanotubes in the as-grown VA-SWNT sample comes from the corresponding Raman spectra measured with a 633, 488, and 785 nm wavelength laser, respectively. As seen in FIG. 2b, the RBM modes of the as-grown VA-SWNTs recorded with 633 and 488 nm lasers reveal dominant features for semiconducting nanotubes (curves with square dots in FIG. 2b) while the corresponding spectra for HiPco SWNTs (curves with circular dots in FIG. 2b) indicate the coexistence of semiconducting and metallic nanotubes. The above observed difference is consistent with FIG. 2a. However, the RBM modes recorded with a 785 nm laser show extensive signals of semiconducting nanotubes for both the as-synthesized VA-SWNTs and HiPco sample since only semiconducting nanotubes can be Raman active at this particular excitation wavelength. Peaks within the rectangles marked with S and M in FIG. 2(a) and (b) correspond to the semiconducting and metallic SWNTs, respectively.

Although it is not easy to precisely measure the percentage of semiconducting nanotubes in the as-grown SWNT array, reasonable estimation can be made from the integrated Raman peak intensities by using commercial HiPco SWNTs as reference. In view of the known ratio of 40%:60% for metallic-to-semiconducting nanotubes in the commercial HiPco sample, it was estimated that about 96% semiconducting nanotubes are in the as-grown VA-SWNT array by comparing its integrated RBM intensity with that of HiPco SWNTs (see FIG. 2a). Similar calculations using the RBMs shown in FIG. 2b recorded with 633- and 488-nm lasers also indicate more than 80% of semiconducting nanotubes in the as-grown VA-SWNT sample, though RBMs associated with the 514-nm laser can be demonstrated to provide the most accurate ratios of the metallic to semiconducting nanotubes in samples enriched with semiconducting nanotubes.

Photoluminescence excitation/emission contour plots of the as-synthesized SWNTs were measured by simply dispersing them in heavy water ($D_2O$) with sodium dodecylbenzene sulfonate (SDBS) without any separation, which revealed the presence of mainly (7,5), (7,6), (8,4), (8,7), (9,5) and (10,2) semiconducting SWNTs.

It was also demonstrated that plasma enhancement plays an important role in the selective growth of semiconducting VA-SWNTs, as is the case for growing their nonaligned counterparts. To ensure stable growth conditions for the preferential formation of semiconducting SWNTs, $C_2H_2$ was used alone without any carrier gas. This, together with the fast heating is believed to minimize any possible disturbance to the growing nanotubes which otherwise would introduce defect(s) into the nanotube structure.

Figure 3B:
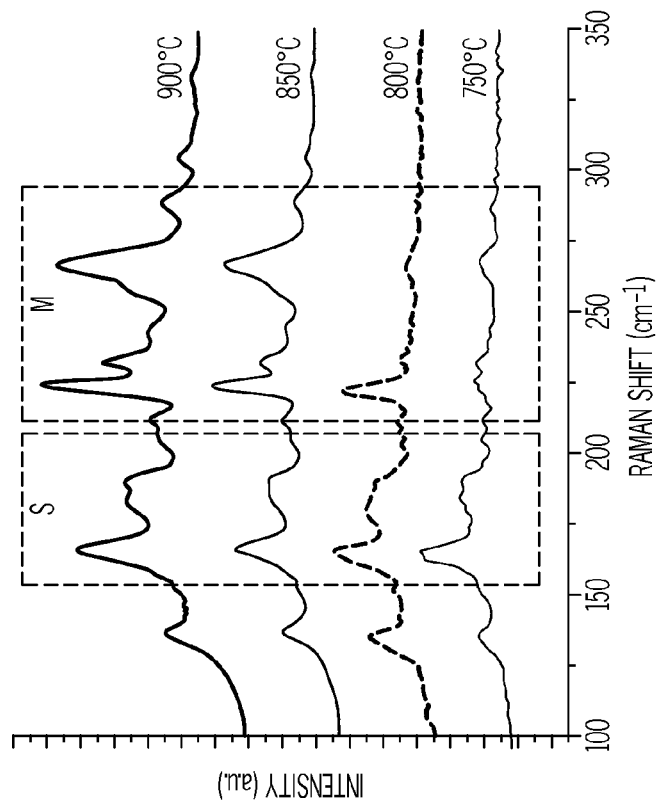
FIGS. 3a and 3b illustrate the influence of growth time and temperature on the selective growth of semi-conducting VA-SWNTs according to an embodiment of the invention.
Figure 3A:
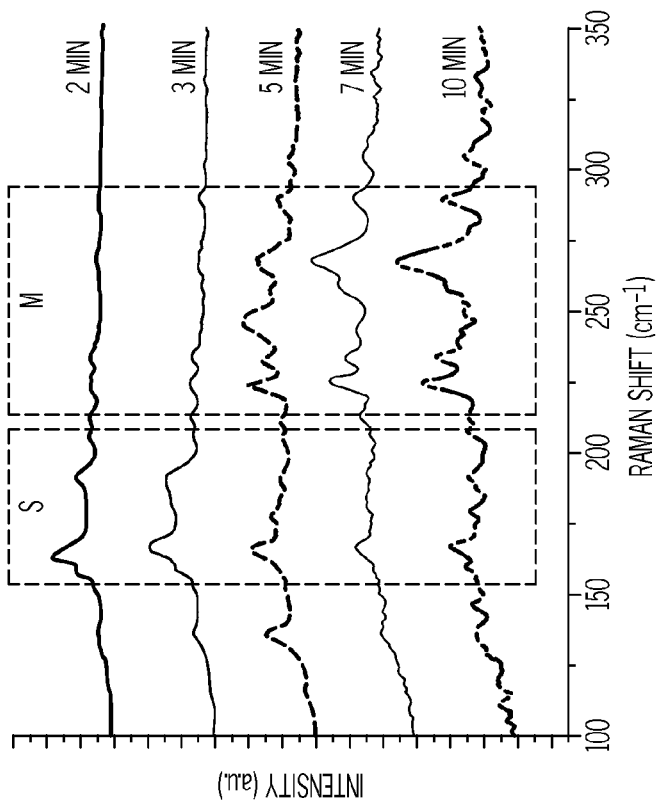

We also found that a well-controlled low gas pressure (30 mTorr $C_2H_2$) is important for the selective growth of semiconducting nanotubes as an increased gas flow rate often facilitates the growth of metallic nanotubes. The growth of semiconducting nanotubes also depends strongly on the growth temperature and time. FIGS. 3a and b illustrate the influence of the growth time (about 750° C.) and temperature (about 3 minutes) for the selective growth of semiconducting VA-SWNTs (514-nm laser). As can be seen, Raman peak intensities corresponding to metallic nanotubes with respect to those of semiconducting nanotubes increased with increasing temperature and growth time. Although these results indicate a narrow growth window for the preferential formation of semiconducting nanotubes, VA-SWNT arrays with more than 95% semiconducting nanotubes have been repeatedly synthesized by carefully controlling the growth parameters (e.g. gas flow rate, temperature, time).

Example 2

About 0.1 mg of the as-synthesized VA-SWNTs from Example 1 were dispersed in about 1 mL dimethylformamide (DMF) under ultrasonication (e.g., Bransonic, 2510R-MT, 100 W) for approximately 10 minutes, followed by solution-casting the slightly dispersed nanotube bundles between the drain and source gold (Au) electrodes pre-fabricated on a $SiO_2$/Si wafer (about 400-nm-thick $SiO_2$) to form a nanotube bundle network FET with the silicon (Si) substrate acting as the gate electrode. For comparison, a network FET based on HiPco SWNTs was prepared according to the same procedure. Bundled nanotubes were deliberately chosen instead of individual nanotubes for the FET investigation in order to demonstrate the high percentage of semiconducting nanotubes in the as-grown VA-SWNT sample.

Figure 4A:
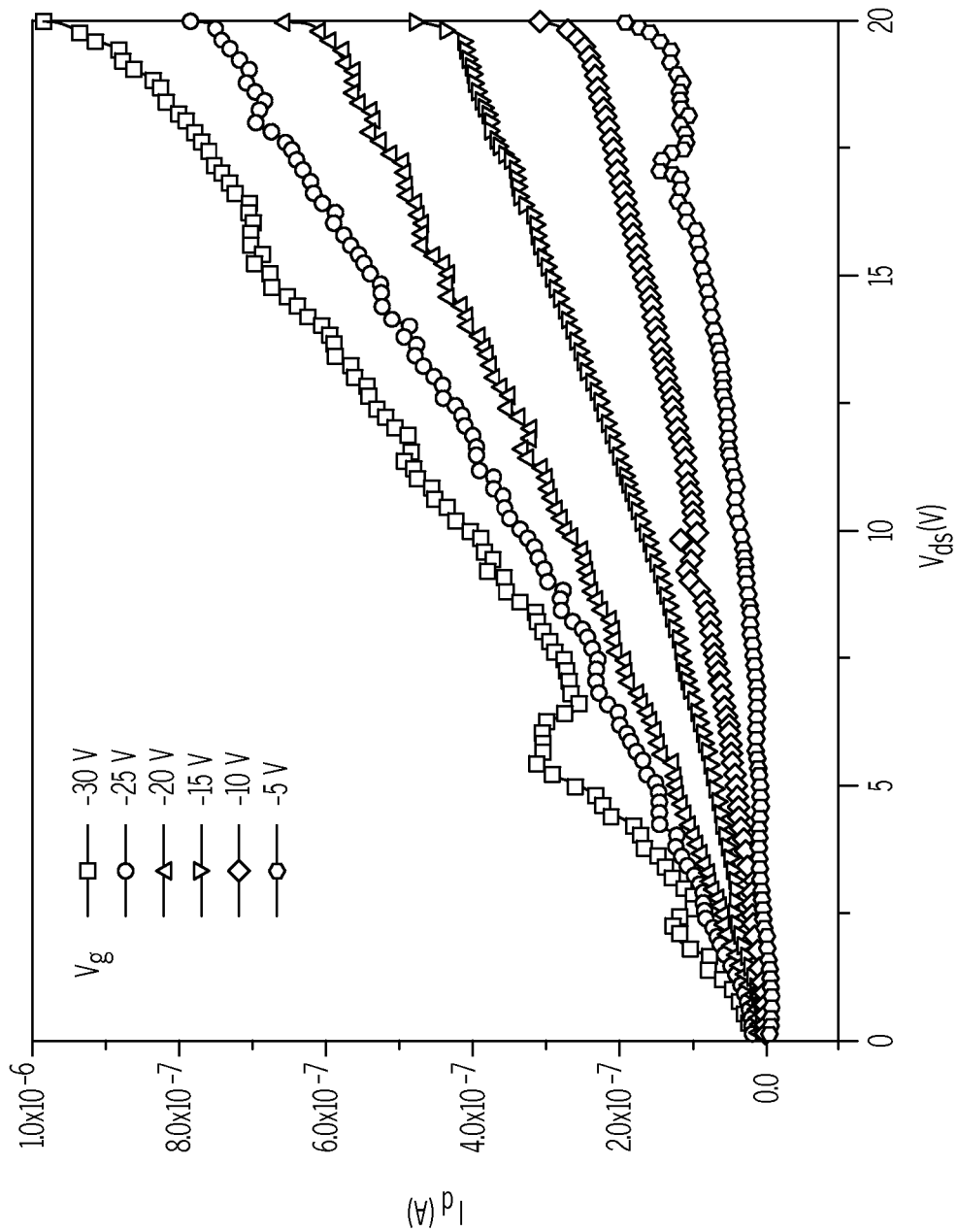
FIGS. 4a, b, and c illustrate a comparison of as-synthesized SWNTs and HiPco SWNTs used as FETs according to an embodiment of the invention.
Figure 4B:
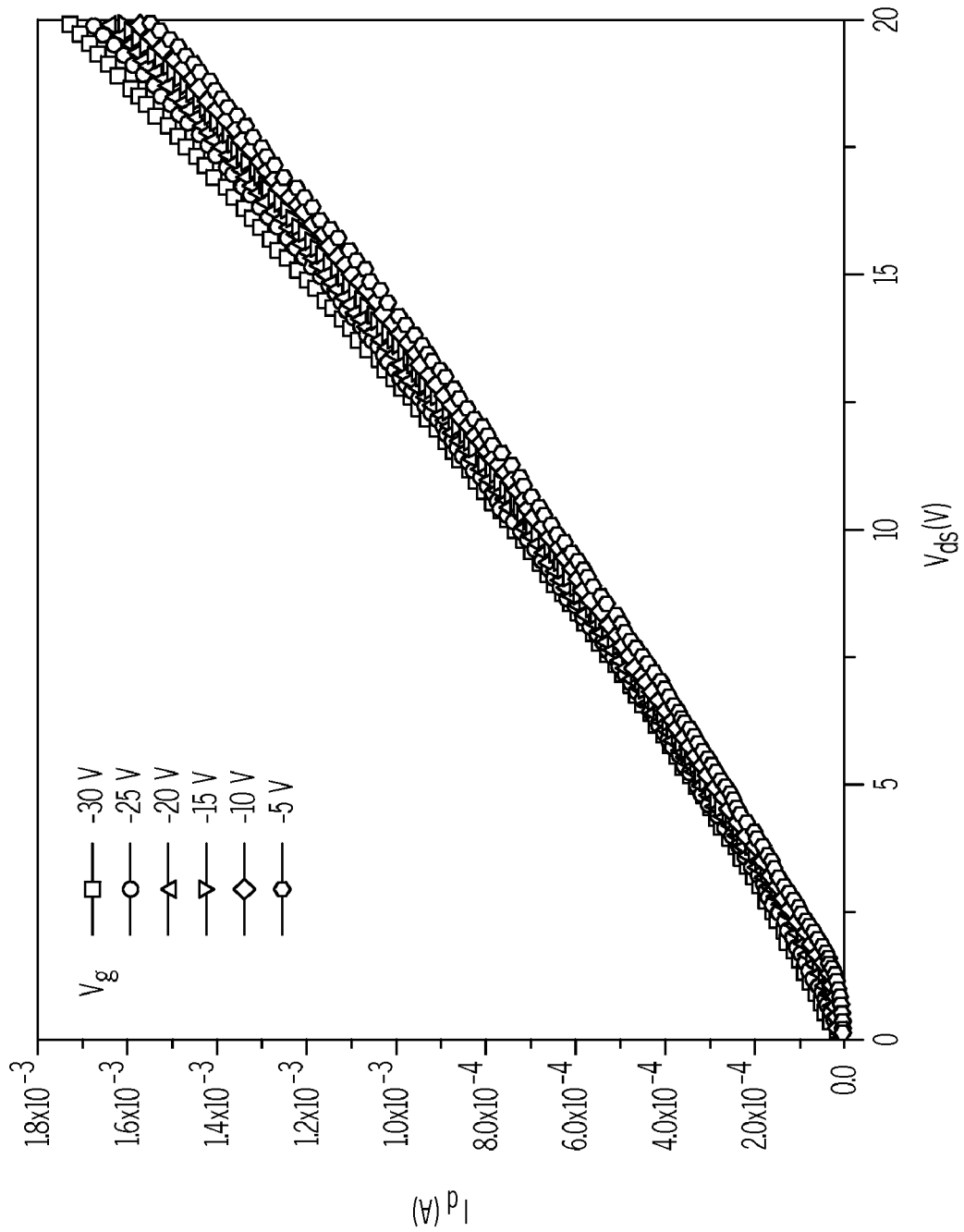
Figure 4C:
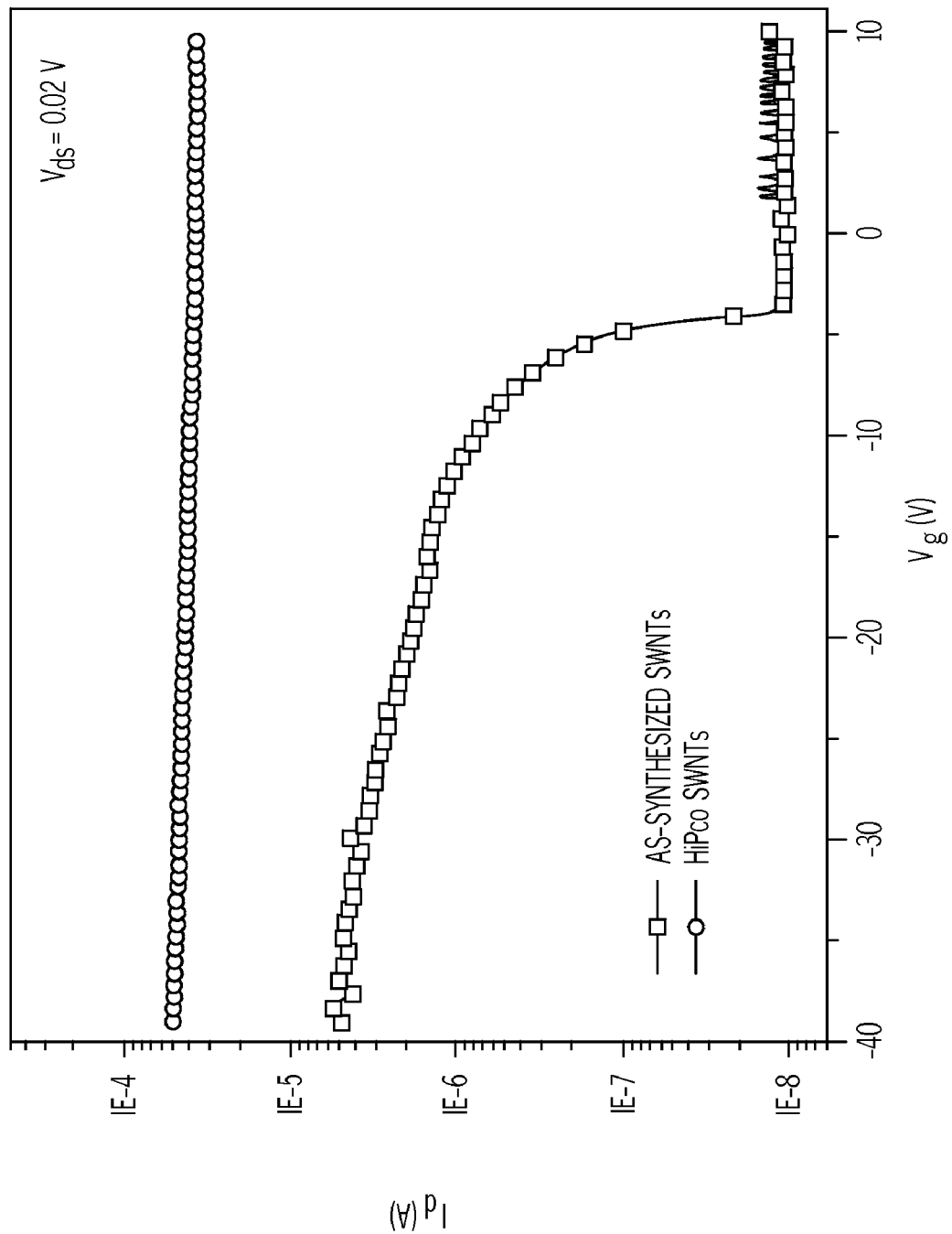

Drain current vs. drain voltage was measured at gate voltages ranging from about −30 to about −5 V in approximately 5 V steps for the as-synthesized SWNT FET (see FIG. 4a) and for HiPco network device (FIG. 4b); and FIG. 4(c) illustrates the drain current vs. gate voltage for both the as-synthesized SWNT (indicated by the -□- line) and HiPco (indicated by the -○- line) network devices measured at a drain voltage of about 0.02 V. As can be seen in FIG. 4a, FETs based on the as-synthesized SWNTs showed a typical field effect characteristic with the drain current increasing with increasing negative gate voltage, indicating a p-type semiconductor for the SWNTs. In contrast, FIG. 4b showed almost no field effect for the corresponding HiPco device. The variations of drain current with the gate voltage for a drain voltage of about 0.02 V shown in FIG. 4c show an on/off ratio of more than about 100 for the as-synthesized SWNT FET in air and a quasi-linear plot with a relatively small slope for the HiPco device. The on/off ratio of more than about 100 for the as-synthesized SWNT network FET can be comparable to that of planar FETs consisting of parallel SWNTs after electrical breakdown of metallic nanotubes.

Since the source-drain channel width for the FETs is close to the nanotube length of about 2-3 µm, the long channel effect associated with high on/off ratios previously observed for short nanotubes dispersed over long channel devices seems to be insignificant. In addition, due to the similar length-scale between the nanotube length and channel width, the low percentage of metallic nanotubes randomly dispersed in the as-synthesized SWNT matrix could be insufficient for the formation a continuous network across the source and drain electrodes to cause any noticeable effect on the FET performance. The above results clearly indicate the high yield of semiconducting nanotubes in the as-synthesized VA-SWNT sample. The mobility (µ) of the as-synthesized SWNTs was estimated, according to the standard formula, to be about 11.4 $cm^2V^{-1}s^{-1}$ in air, which is slightly higher than that of a planar FET after electrical breakdown of metallic nanotubes.

Figure 5:
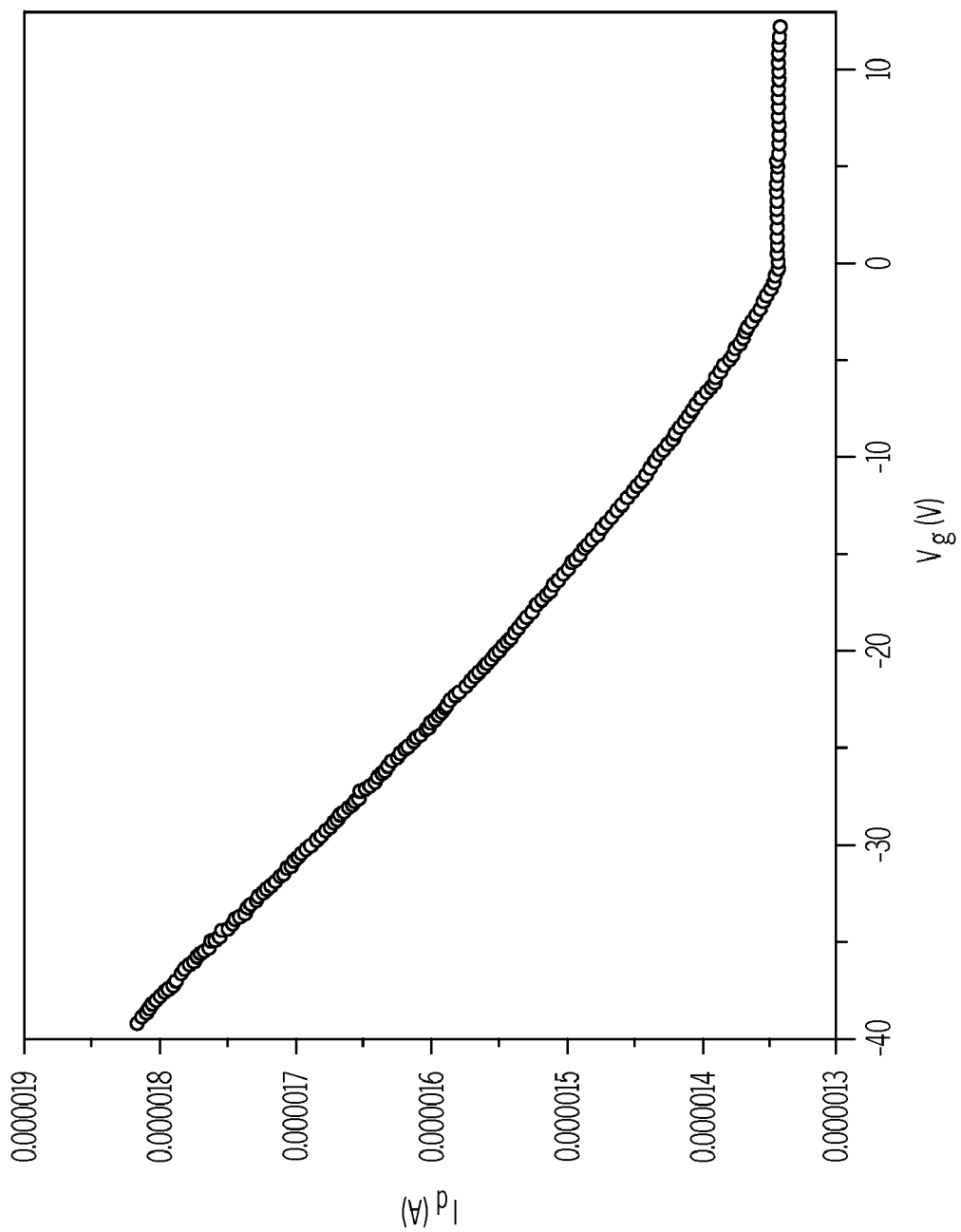
FIG. 5 illustrates drain current vs. gate voltage measured at a drain voltage of 0.1 V on the as-synthesized SWNT arrays according to an embodiment of the invention.

FIG. 5 illustrates drain current vs gate voltage measured at a drain voltage of about 0.1 V on the as-synthesized SWNT arrays (the distance of source to drain is about 10 µm). More than 10 FET devices based on the as-synthesized SWNTs were investigated and it was found that the overall on/off ratio was around $10^2$ and mobility was about 4.2 to about 13 $cm^2V^{-1}s^{-1}$. The relatively high mobility observed indicates that the bundled semiconducting SWNT network can transport electrons efficiently. A FET device based on the as-synthesized VA-SWNT array with the source and drain electrodes directly deposited onto the top surface of the VA-SWNTs supported by a $SiO_2$/Si wafer (about 400-nm-thick $SiO_2$ with the Si substrate acting as the gate electrode) was also constructed (see FIG. 6). Preliminary results indicated that the vertically constructed FET from the as-synthesized VA-SWNT array shows a reasonably strong field effect as shown in FIG. 5.

In conclusion, it was demonstrated that preferential synthesis of vertically-aligned SWNTs with the percentage content of semiconducting nanotubes up to about 96% can be achieved by using the combined plasma-enhanced CVD and fast heating method for pyrolysis of pure $C_2H_2$ under a low pressure (about 30 mTorr). The high yield of the resultant semiconducting SWNTs was confirmed by systematic Raman spectroscopic measurements. Photoluminescence excitation/emission spectroscopic measurements revealed the presence of mainly (7,5), (7,6), (8,4), (8,7), (9,5) and (10.2) semiconducting SWNTs. The as-synthesized semiconducting SWNT arrays can be used directly for fabricating either vertically-constructed or horizontally-deposited nanotube network FET devices without any purification or separation. The nanotube network FETs showed a very good device performance comparable to that of SWNT thin film FETs after electrical breakdown of metallic nanotubes. The selectively-grown semiconducting VA-SWNT arrays can be used for the development of various optoelectronic nanodevices with high performance.

Having described the disclosure in detail and by reference to specific embodiments thereof, it will be apparent that modifications and variations are possible without departing from the scope of the disclosure defined in the appended claims. More specifically, although some aspects of the present disclosure are identified herein as preferred or particularly advantageous, it is contemplated that the present disclosure is not necessarily limited to these preferred aspects of the disclosure.

What is claimed is:

1. A method of synthesizing semiconducting vertically-aligned single-walled carbon nanotubes comprising:

providing a semiconductor wafer containing a catalyst coating on its surface;

providing an iron catalyst on said catalyst-coated wafer;

placing said wafer in a plasma-enhanced chemical vapor deposition furnace maintained at a pressure between about 25 to 35 mTorr and at a temperature of about between about 745 to 755° C., said furnace including a source of carbon gas; and removing said wafer from said furnace after about 2 to 4 minutes; wherein said synthesized nanotubes comprise at least 80% semiconducting nanotubes;

wherein said carbon gas comprises $C_2H_2$; and forming an FET device from the synthesized semiconducting vertically-aligned single-walled carbon nanotubes comprising depositing said nanotubes over preformed source and drain electrodes supported on said wafer.

2. The method of claim 1 wherein said furnace is maintained at a pressure of about 30 mTorr.

3. The method of claim 1 wherein said furnace is maintained at a temperature of about 750° C.

4. The method of claim 1 wherein said semiconductor wafer comprises $SiO_2$/Si.

5. The method of claim 1 wherein said catalyst coating on said wafer surface comprises aluminum.

6. Vertically-aligned single-walled carbon nanotubes formed by the method of claim 1.

7. The nanotubes of claim 6 having a diameter of from about 0.8 to about 2 nm.

8. The method of claim 1 wherein said synthesized nanotubes comprise at least 95% semiconducting nanotubes.

* * * * *